US010320069B2

(12) United States Patent
Zhou et al.

(10) Patent No.: US 10,320,069 B2
(45) Date of Patent: Jun. 11, 2019

(54) ELECTRONIC DEVICE ANTENNAS HAVING DISTRIBUTED CAPACITANCES

(71) Applicant: Apple Inc., Cupertino, CA (US)

(72) Inventors: Yijun Zhou, Mountain View, CA (US); Jennifer M. Edwards, San Francisco, CA (US); Yiren Wang, Santa Clara, CA (US); Hao Xu, Cupertino, CA (US); Ming-Ju Tsai, Sunnyvale, CA (US); Mattia Pascolini, San Francisco, CA (US)

(73) Assignee: Apple Inc., Cupertino, CA (US)

(*) Notice: Subject to any disclaimer, the term of this patent is extended or adjusted under 35 U.S.C. 154(b) by 138 days.

(21) Appl. No.: 15/701,246

(22) Filed: Sep. 11, 2017

(65) Prior Publication Data

US 2019/0081393 A1 Mar. 14, 2019

(51) Int. Cl.

| | |
|---|---|
| ***H01Q 1/48*** | (2006.01) |
| ***H05K 5/00*** | (2006.01) |
| ***H01Q 1/20*** | (2006.01) |
| ***H01Q 3/00*** | (2006.01) |

(52) U.S. Cl.

CPC ................ *H01Q 1/48* (2013.01); *H01Q 1/20* (2013.01); *H01Q 3/00* (2013.01); *H05K 5/0017* (2013.01)

(58) Field of Classification Search

CPC .. H01Q 1/48; H01Q 1/20; H01Q 3/00; H05K 5/00

USPC .......................................................... 343/846

See application file for complete search history.

(56) References Cited

U.S. PATENT DOCUMENTS

| | | | | |
|---|---|---|---|---|
| 6,614,399 | B2 * | 9/2003 | Trumbull ............... | H01Q 1/243 343/700 MS |
| 8,102,318 | B2 | 1/2012 | Chiang et al. | |
| 9,019,163 | B2 * | 4/2015 | Asanuma ................ | H01Q 9/42 343/702 |

(Continued)

OTHER PUBLICATIONS

Wong et al., "Small-size internal eight-band LTE/WWAN mobile phone antenna with internal distributed LC matching circuit", Microwave and Optical Technology Letters; DOI: 10.1002/mop. 25431; Jul. 14, 2010. <http://onlinelibrary.wiley.com/doi/10.1002/mop.25431/full>.

*Primary Examiner* — Andrea Lindgren Baltzell

(74) *Attorney, Agent, or Firm* — Treyz Law Group, P.C.; Joseph F. Guihan

(57) ABSTRACT

An electronic device may be provided with wireless circuitry. The wireless circuitry may include multiple antennas and transceiver circuitry. An antenna may have an antenna resonating element formed from portions of a peripheral conductive electronic device housing structure and may have an antenna ground that is separated from the antenna resonating element by a gap. The antenna ground for the antenna may include a first conductive structure that is separated from the antenna resonating element by a first distance and a second conductive structure that is electrically connected to the first conductive structure and separated from the antenna resonating element by a second distance that is less than the first distance. A distributed impedance matching capacitor for the antenna may be formed from the second conductive structure and the antenna resonating element arm. The second conductive structure may be a conductive frame for an electronic component such as a sensor.

20 Claims, 9 Drawing Sheets

(56) References Cited

U.S. PATENT DOCUMENTS 9,041,619 B2 5/2015 McMilin et al.
9,325,066 B2 4/2016 Wong et al.

* cited by examiner

ELECTRONIC DEVICE ANTENNAS HAVING DISTRIBUTED CAPACITANCES

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to form electronic device antenna structures with desired attributes. In some wireless devices, antennas are bulky. In other devices, antennas are compact, but are sensitive to the position of the antennas relative to external objects. If care is not taken, antennas may become detuned, may emit wireless signals with a power that is more or less than desired, or may otherwise not perform as expected.

It would therefore be desirable to be able to provide improved wireless circuitry for electronic devices.

SUMMARY

An electronic device may be provided with wireless circuitry and control circuitry. The wireless circuitry may include multiple antennas and transceiver circuitry. The antennas may include antenna structures at opposing first and second ends of the electronic device. The antenna structures at a given end of the device may include adjustable components that are adjusted by the control circuitry to place the antenna structures and the electronic device in one of a number of different operating modes or states.

An antenna in the electronic device may have an inverted-F antenna resonating element formed from portions of a peripheral conductive electronic device housing structure and may have an antenna ground that is separated from the antenna resonating element by a gap. A short circuit path may bridge the gap. An antenna feed may be coupled across the gap in parallel with the short circuit path.

The antenna ground for the antenna may include a first conductive structure that is separated from the inverted-F antenna resonating element by a first distance and a second conductive structure that is electrically connected to the first conductive structure and separated from the inverted-F antenna resonating element by a second distance that is less than the first distance. A distributed impedance matching capacitor for the antenna may be formed from the second conductive structure and the antenna resonating element arm.

The first conductive structure may be a planar conductive layer that extends between the first and second sidewalls of the electronic device housing. The second conductive structure may be a conductive frame for an electronic component such as a sensor. The electronic component may be interposed between lower and upper portions of the conductive frame. A conductive spring may electrically connect the lower portion of the conductive frame to the planar conductive layer.

DETAILED DESCRIPTION

Figure 1:
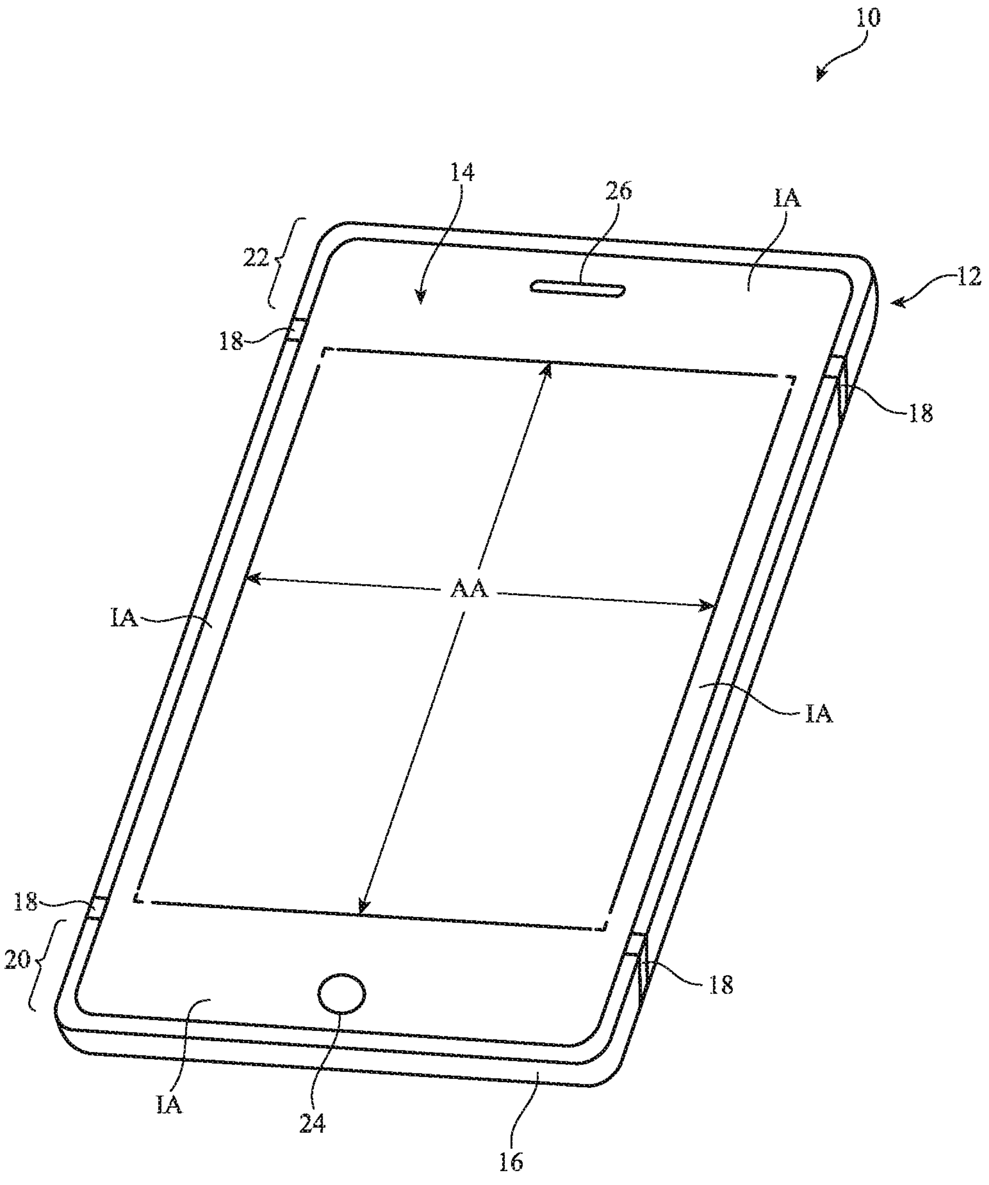
FIG. 1 is a perspective view of an illustrative electronic device in accordance with an embodiment.

Electronic devices such as electronic device 10 of FIG. 1 may be provided with wireless communications circuitry. The wireless communications circuitry may be used to support wireless communications in multiple wireless communications bands.

The wireless communications circuitry may include one more antennas. The antennas of the wireless communications circuitry can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures.

The conductive electronic device structures may include conductive housing structures. The housing structures may include peripheral structures such as peripheral conductive structures that run around the periphery of an electronic device. The peripheral conductive structures may serve as a bezel for a planar structure such as a display, may serve as sidewall structures for a device housing, may have portions that extend upwards from an integral planar rear housing (e.g., to form vertical planar sidewalls or curved sidewalls), and/or may form other housing structures.

Gaps may be formed in the peripheral conductive structures that divide the peripheral conductive structures into peripheral segments. One or more of the segments may be used in forming one or more antennas for electronic device 10. Antennas may also be formed using an antenna ground plane and/or an antenna resonating element formed from conductive housing structures (e.g., internal and/or external structures, support plate structures, etc.).

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a planar housing wall. The rear housing wall may have slots that pass entirely through the rear housing wall and that therefore separate housing wall portions (and/or sidewall portions) of housing 12 from each other. The rear housing wall may include conductive portions and/or dielectric portions. If desired, the rear housing wall may include a planar metal layer covered by a thin layer or coating of dielectric such as glass, plastic, sapphire, or ceramic. Housing 12 (e.g., the rear housing wall, sidewalls, etc.) may also have shallow grooves that do not pass entirely through housing 12. The slots and grooves may be filled with plastic or other dielectric. If desired, portions of housing 12 that have been separated from each other (e.g., by a through slot) may be joined by internal conductive structures (e.g., sheet metal or other metal members that bridge the slot).

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, thin-film transistor layer, or other display layer. Buttons such as button 24 may pass through openings in the cover layer if desired. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may, if desired, form sidewall structures for device 10 (e.g., by forming a metal band with vertical sidewalls, curved sidewalls, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface or wall. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as flat or curved vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions. Peripheral conductive housing structures 16 and/or the conductive rear wall of housing 12 may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide structures 16 from view of the user).

Display 14 may have an array of pixels that form an active area AA that displays images for a user of device 10. An inactive border region such as inactive area IA may run along one or more of the peripheral edges of active area AA.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a backplate) that spans the walls of housing 12 (i.e., a substantially rectangular sheet formed from one or more metal parts that is welded or otherwise connected between opposing sides of member 16). The backplate may form an exterior rear surface of device 10 or may be covered by layers such as thin cosmetic layers, protective coatings, and/or other coatings that may include dielectric materials such as glass, ceramic, plastic, or other structures that form the exterior surfaces of device 10 and/or serve to hide the backplate from view of the user. Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 16 and opposing conductive ground structures such as conductive portions of housing 12, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22), thereby narrowing the slots in regions 20 and 22.

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with peripheral gap structures. For example, peripheral conductive housing structures 16 may be provided with one or more peripheral gaps such as gaps 18, as shown in FIG. 1. The gaps in peripheral housing structures 16 may be filled with dielectric such as polymer, ceramic, glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two of gaps 18), three peripheral conductive segments (e.g., in an arrangement with three of gaps 18), four peripheral conductive segments (e.g., in an arrangement with four of gaps 18, etc.). The segments of peripheral conductive housing structures 16 that are formed in this way may form parts of antennas in device 10.

If desired, openings in housing 12 such as grooves that extend partway or completely through housing 12 may extend across the width of the rear wall of housing 12 and may penetrate through the rear wall of housing 12 to divide the rear wall into different portions. These grooves may also extend into peripheral housing structures 16 and may form antenna slots, gaps 18, and other structures in device 10. Polymer or other dielectric may fill these grooves and other housing openings. In some situations, housing openings that form antenna slots and other structure may be filled with a dielectric such as air.

In a typical scenario, device 10 may have one or more upper antennas and one or more lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
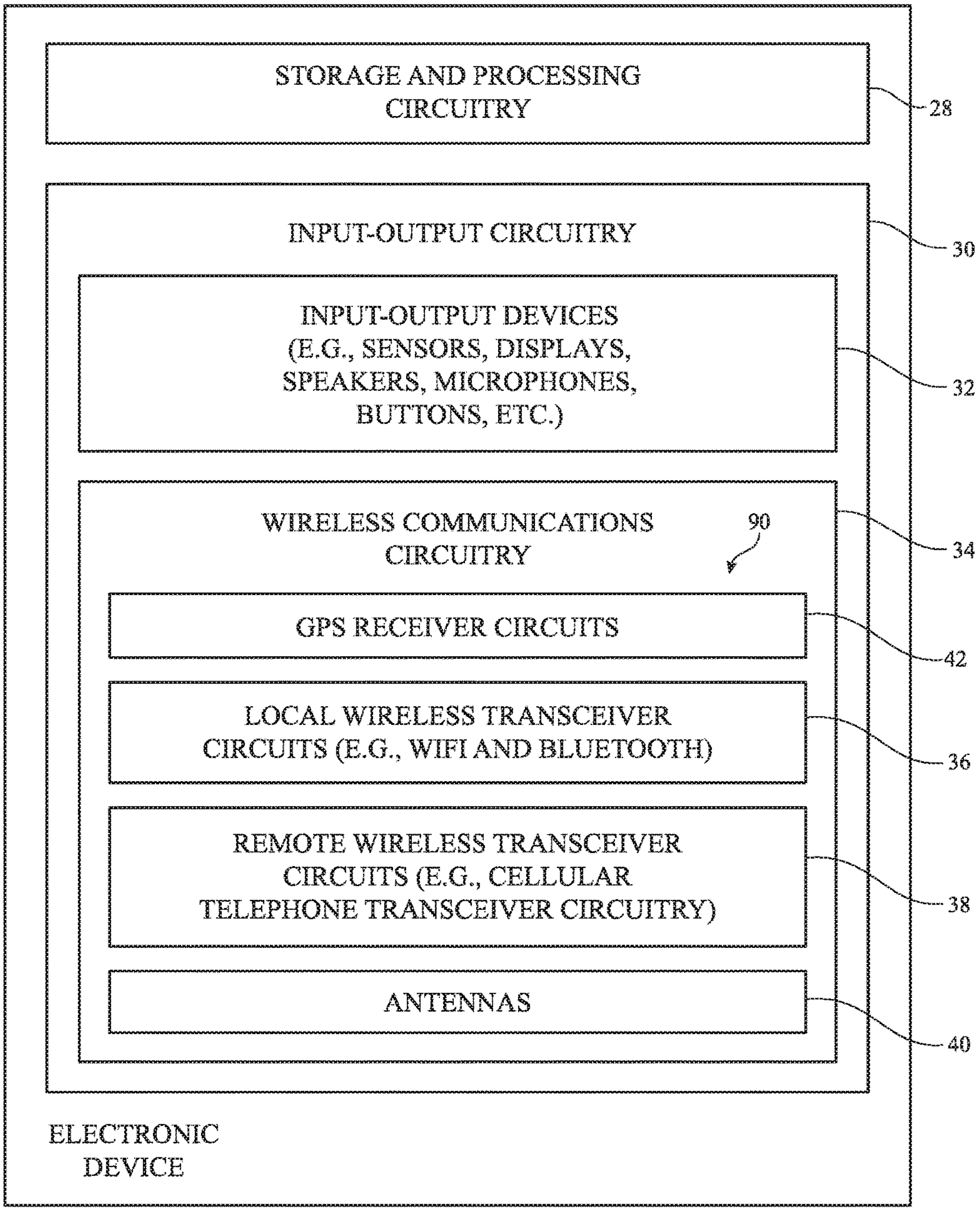
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, multiple-input and multiple-output (MIMO) protocols, antenna diversity protocols, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, position and orientation sensors (e.g., sensors such as accelerometers, gyroscopes, and compasses), capacitance sensors, proximity sensors (e.g., capacitive proximity sensors, light-based proximity sensors, etc.), fingerprint sensors (e.g., a fingerprint sensor integrated with a button such as button 24 of FIG. 1 or a fingerprint sensor that takes the place of button 24), etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz or other communications bands between 600 MHz and 4000 MHz or other suitable frequencies (as examples).

Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, dipole antenna structures, monopole antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
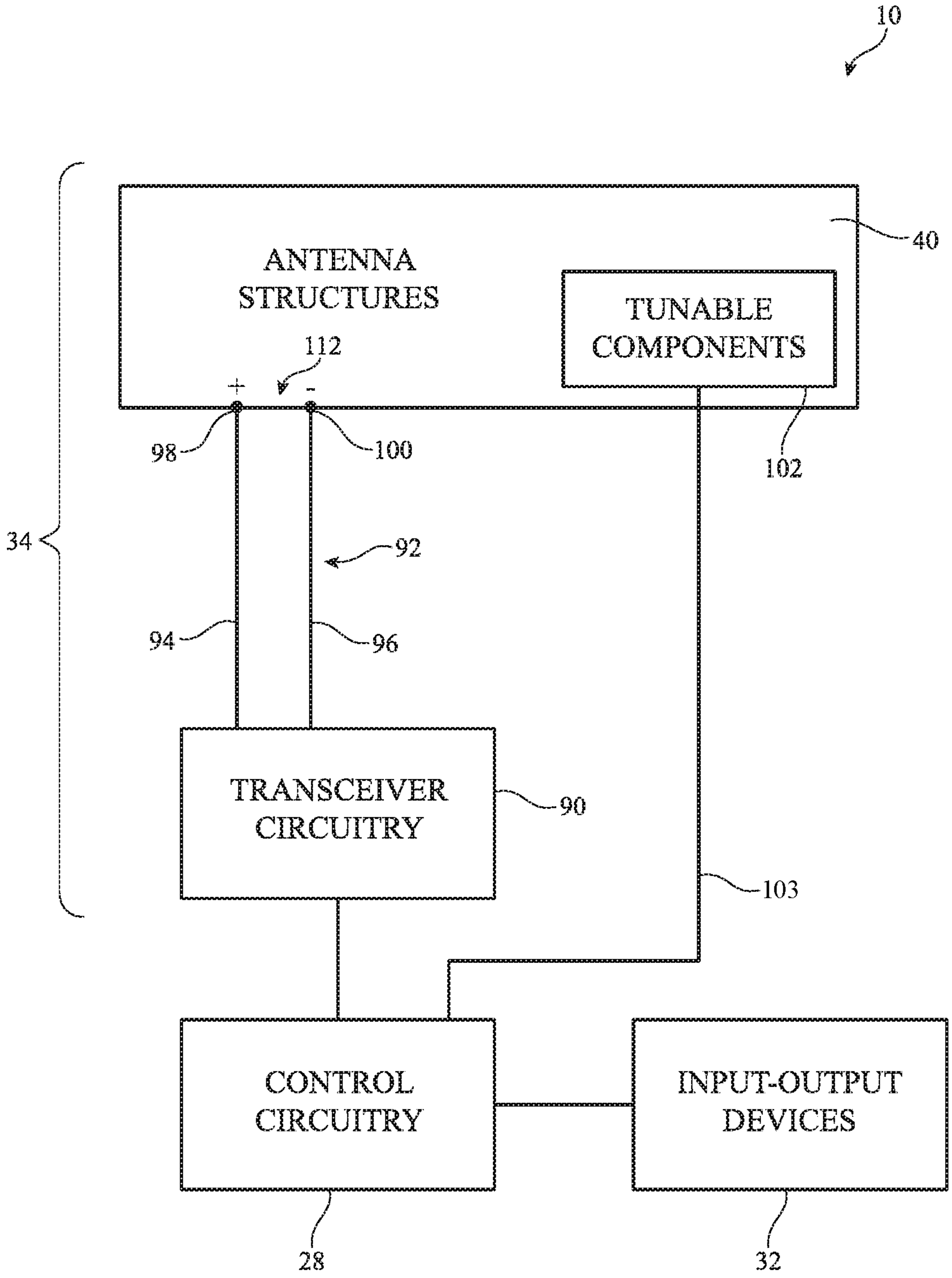
FIG. 3 is a diagram of illustrative wireless circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 28. Control circuitry 28 may be coupled to input-output devices 32. Input-output devices 32 may supply output from device 10 and may receive input from sources that are external to device 10.

To provide antenna structures such as antenna(s) 40 with the ability to cover communications frequencies of interest, antenna(s) 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna (s) 40 may be provided with adjustable circuits such as tunable components 102 to tune antennas over communications bands of interest. Tunable components 102 may be part of a tunable filter or tunable impedance matching network, may be part of an antenna resonating element, may span a gap between an antenna resonating element and antenna ground, etc.

Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 28 may issue control signals on one or more paths such as path 103 that adjust inductance values, capacitance values, or other parameters associated with tunable components 102, thereby tuning antenna structures 40 to cover desired communications bands.

Path 92 may include one or more transmission lines. As an example, signal path 92 of FIG. 3 may be a transmission line having a positive signal conductor such as line 94 and a ground signal conductor such as line 96. Lines 94 and 96 may form parts of a coaxial cable, a stripline transmission line, or a microstrip transmission line (as examples). A matching network (e.g., an adjustable matching network formed using tunable components 102) may include components such as inductors, resistors, and capacitors used in matching the impedance of antenna(s) 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna(s) 40 and may be tunable and/or fixed components.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed 112 with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 100. Other types of antenna feed arrangements may be used if desired. For example, antenna structures 40 may be fed using multiple feeds. The illustrative feeding configuration of FIG. 3 is merely illustrative.

Control circuitry 28 may use information from a proximity sensor (see, e.g., sensors 32 of FIG. 2), wireless performance metric data such as received signal strength information, device orientation information from an orientation sensor, device motion data from an accelerometer or other motion detecting sensor, information about a usage scenario of device 10, information about whether audio is being played through speaker 26, information from one or more antenna impedance sensors, and/or other information in determining when antenna(s) 40 is being affected by the presence of nearby external objects or is otherwise in need of tuning. In response, control circuitry 28 may adjust an adjustable inductor, adjustable capacitor, switch, or other tunable component 102 to ensure that antenna structures 40 operate as desired. Adjustments to component 102 may also be made to extend the coverage of antenna structures 40

(e.g., to cover desired communications bands that extend over a range of frequencies larger than antenna structures 40 would cover without tuning).

Antennas 40 may include slot antenna structures, inverted-F antenna structures (e.g., planar and non-planar inverted-F antenna structures), loop antenna structures, combinations of these, or other antenna structures.

Figure 4:
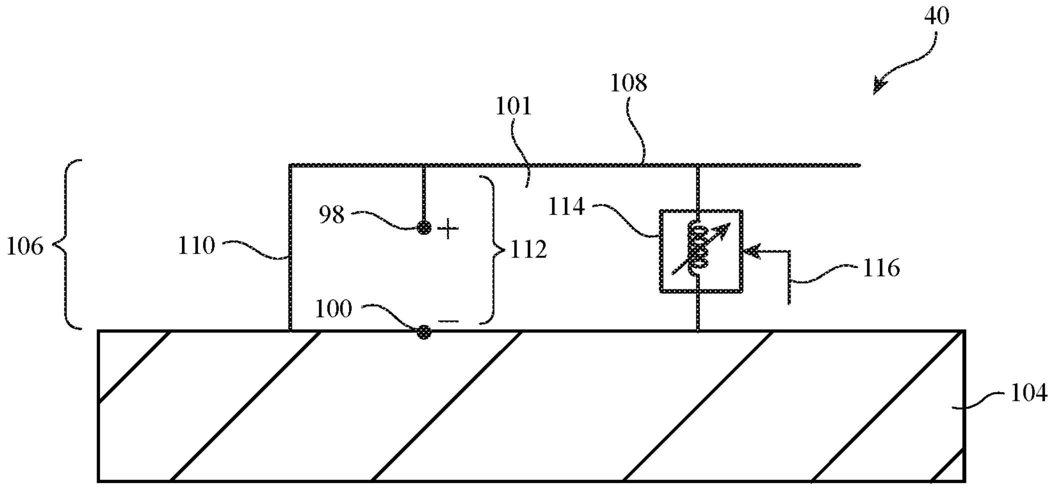
FIG. 4 is a diagram of an illustrative inverted-F antenna in accordance with an embodiment.

An illustrative inverted-F antenna structure is shown in FIG. 4. As shown in FIG. 4, inverted-F antenna structure 40 (sometimes referred to herein as antenna 40 or inverted-F antenna 40) may include an inverted-F antenna resonating element such as antenna resonating element 106 and an antenna ground (ground plane) such as antenna ground 104. Antenna resonating element 106 may have a main resonating element arm such as arm 108. The length of arm 108 may be selected so that antenna structure 40 resonates at desired operating frequencies. For example, the length of arm 108 (or a branch of arm 108) may be a quarter of a wavelength at a desired operating frequency for antenna 40. Antenna structure 40 may also exhibit resonances at harmonic frequencies. If desired, slot antenna structures or other antenna structures may be incorporated into an inverted-F antenna such as antenna 40 of FIG. 4 (e.g., to enhance antenna response in one or more communications bands). As an example, a slot antenna structure may be formed between arm 108 or other portions of resonating element 106 and ground 104. In these scenarios, antenna 40 may include both slot antenna and inverted-F antenna structures and may sometimes be referred to as a hybrid inverted-F and slot antenna.

Arm 108 may be separated from ground 104 by a dielectric-filled opening such as dielectric gap 101. Antenna ground 104 may be formed from housing structures such as a conductive support plate, printed circuit traces, conductive portions of a display, metal portions of electronic components, or other conductive ground structures. Gap 101 may be formed by air, plastic, and/or other dielectric materials.

Main resonating element arm 108 may be coupled to ground 104 by return path 110. Antenna feed 112 may include positive antenna feed terminal 98 and ground antenna feed terminal 100 and may run parallel to return path 110 between arm 108 and ground 104. If desired, inverted-F antenna structures such as illustrative antenna structure 40 of FIG. 4 may have more than one resonating arm branch (e.g., to create multiple frequency resonances to support operations in multiple communications bands) or may have other antenna structures (e.g., parasitic antenna resonating elements, tunable components to support antenna tuning, etc.). Arm 108 may have other shapes and may follow any desired path if desired (e.g., paths having curved and/or straight segments).

If desired, antenna 40 may include one or more adjustable circuits (e.g., tunable components 102 of FIG. 3) that are coupled to antenna resonating element structures 106 such as arm 108. As shown in FIG. 4, for example, tunable components 102 such as adjustable inductor 114 may be coupled between antenna resonating element arm structures in antenna 40 such as arm 108 and antenna ground 104 (e.g., adjustable inductor 114 may bridge gap 101). Adjustable inductor 114 may exhibit an inductance value that is adjusted in response to control signals 116 provided to adjustable inductor 114 from control circuitry 28.

Figure 5:
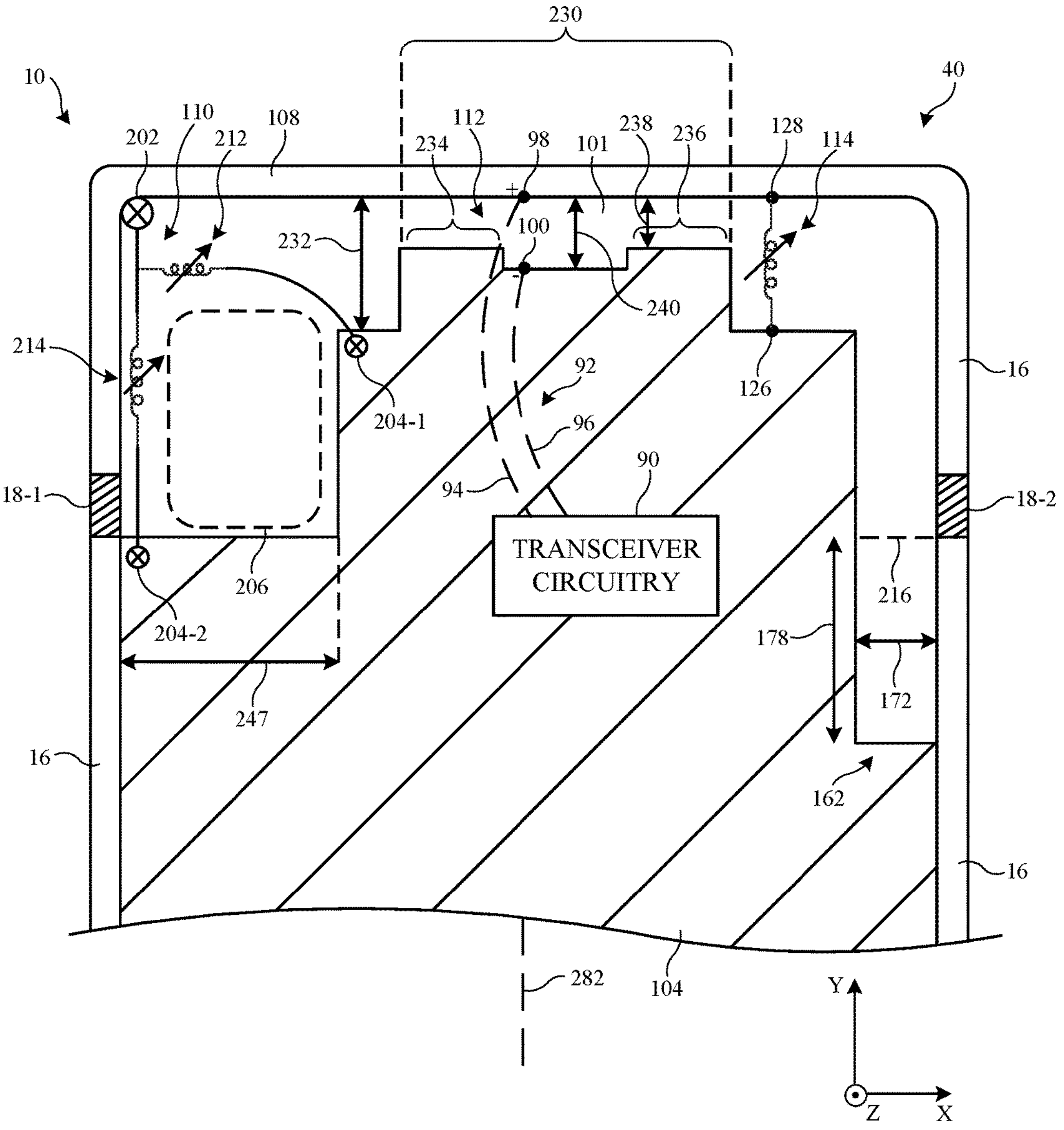
FIG. 5 is a top view of an illustrative electronic device having an inverted-F antenna with a distributed capacitance in accordance with an embodiment.

A top interior view of an illustrative portion of device 10 that contains antennas is shown in FIG. 5. As shown in FIG. 5, device 10 may have peripheral conductive housing structures such as peripheral conductive housing structures 16. Peripheral conductive housing structures 16 may be divided by dielectric-filled peripheral gaps (e.g., plastic gaps) 18 such as gaps 18-1 and 18-2. Antenna 40 may include a resonating element and ground 104. In the example of FIG. 5, the resonating element may include an inverted-F antenna resonating element arm such as arm 108 that is formed from a segment of peripheral conductive housing structures 16 extending between gaps 18-1 and 18-2. Air and/or other dielectric may fill slot 101 between arm 108 and ground structures 104. If desired, opening 101 may be configured to form a slot antenna resonating element structure that contributes to the overall performance of the antenna. Antenna ground 104 may be formed from conductive housing structures, from electrical device components in device 10, from printed circuit board traces, from strips of conductor such as strips of wire and metal foil, or other conductive structures. In one suitable arrangement ground 104 has portions formed from conductive portions of housing 12 (e.g., portions of a rear wall of housing 12 and portions of peripheral conductive housing structures 16 that are separated from arm 108 by peripheral gaps 18-1 and 18-2). Antenna ground 104 may also have portions formed by portions of display 14 (e.g., conductive portions of a display panel, a conductive plate for supporting the display panel, and/or a conductive frame for supporting the conductive plate and/or the display panel).

If desired, opening 101 may contribute slot antenna resonances in one or more frequency bands for antenna 40. Antenna 40 may sometimes be referred to herein as an inverted-F antenna or a hybrid inverted-F slot antenna (e.g., because slot 101 may contribute to the frequency response of antenna 40).

Ground 104 may serve as antenna ground for one or more antennas. For example, inverted-F antenna 40 may include resonating element arm 108 and ground 104, whereas another antenna (e.g., a wireless local area network and/or ultra-high band antenna) may be formed from a separate resonating element in region 206 and ground 104. Inverted-F antenna 40 may be fed using an antenna feed such as feed 112 having positive feed terminal 98 coupled to peripheral conductive housing structures 16 and ground feed terminal 100 coupled to antenna ground 104. Positive transmission line conductor 94 and ground transmission line conductor 96 may form transmission line 92 coupled between transceiver circuitry 90 and antenna feed 112.

Antenna feed 112 may be coupled across slot 101 at a location along antenna ground 104 that is within a distributed capacitance region 230. In the distributed capacitance region, antenna ground 104 may be separated from peripheral conductive structures 16 by distances 238 and 240. Distances 238 and 240 may, for example, be selected so that a desired distributed capacitance is formed between ground 104 and peripheral conductive housing structures 16 around feed 112. The distributed capacitance may be selected to ensure that antenna 40 is impedance matched to transmission line 92, for example. The distributed capacitance region 230 may be surrounded by two regions where ground plane 104 is separated from peripheral conductive housing structures 16 by distance 232 (that is greater than distances 238 and 240), if desired. Antenna ground 104 and peripheral conductive housing structures 16 may form a distributed impedance matching capacitor in region 230. In some situations, regions 234 and 236 of antenna ground 104 may referred to as forming independent distributed inductance matching capacitors.

Distributed capacitance region 230 may include regions 234 and 236 where ground 104 is separated from peripheral conductive housing structures 16 by distance 238. In the region interposed between regions 234 and 236, ground 104 is separated from peripheral conductive housing structures 16 by distance 240. In the example of FIG. 5, antenna feed 112 is coupled across slot 101 at a location along antenna ground 104 where antenna ground 104 is separated from peripheral conductive housing structures 16 by distance 240. These examples are merely illustrative. In general, antenna ground 104 may be separated from peripheral conductive housing structures 16 by any desired distance in region 230 to form a desired distributed capacitance between ground 104 and peripheral conductive housing structures 16 around feed 112. Antenna ground 104 may be separated from peripheral conductive housing structures 16 by a uniform distance in distributed capacitance region 230 or by two or more different distances in distributed capacitance region 230. Additionally, antenna feed 112 may be coupled across slot 101 at any desired location (e.g., at a location in the distributed capacitance region where ground 104 and peripheral conductive structures 16 are separated by distance 240, at a location in the distributed capacitance region where ground 104 and peripheral conductive structures 16 are separated by distance 238, at a location outside of the distributed capacitance region where ground 104 and peripheral conductive structures 16 are separated by distance 232, etc.). The distance between ground 104 and peripheral conductive structures 16 is inversely proportional to the distributed capacitance of region 230. The location of the antenna feed and the separation between the antenna ground 104 and the peripheral conductive housing structures 16 in distributed capacitance region 230 may be chosen to exhibit one or more desired capacitances to ensure that antenna 40 is impedance matched to transmission line 92.

Including the distributed capacitance in region 230 may allow an additional component such as a surface mount technology capacitor to be omitted, thereby conserving space within the electronic device. Additionally, forming the distributed impedance matching capacitor between peripheral conductive structures 16 and antenna ground 104 may improve antenna efficiency over a wider range of frequencies than if a surface mount technology capacitor is coupled between peripheral conductive structures 16 and antenna ground 104.

Distances 232, 238, and 240 in FIG. 5 may be any desired distances. For example, distance 232 may be about 2 mm, less than 4 mm, less than 3 mm, less than 2 mm, less than 1 mm, more than 0.5 mm, more than 1.5 mm, more than 2.5 mm, 1-3 mm, or another desired distance. Distance 238 may be about 1 mm, less than 4 mm, less than 3 mm, less than 2 mm, less than 1 mm, less than 0.5 mm, between 0.5 and 2 mm, between 0.5 and 1.5 mm, more than 0.5 mm, more than 1.5 mm, more than 2.5 mm, 1-3 mm, or another desired distance. Distance 240 may be about 1 mm, less than 4 mm, less than 3 mm, less than 2 mm, less than 1 mm, less than 0.5 mm, between 0.5 and 2 mm, between 0.5 and 1.5 mm, more than 0.5 mm, more than 1.5 mm, more than 2.5 mm, 1-3 mm, or another desired distance.

Transceiver circuitry 90 may include cellular telephone transceiver circuitry (e.g., remote wireless transceiver circuitry 38 as shown in FIG. 2) that handles wireless communications in frequency ranges such as a low communications band from 700 to 960 MHz, a low-midband from 960 to 1710 MHz, a midband from 1710 to 2170 MHz, a high band from 2300 to 2700 MHz, and/or an ultra-high band from 3400 to 3700 MHz, for example. Transceiver circuitry 90 may use transmission line 92 and feed 112 to handle low band, low-midband, midband, high band, and/or ultra-high band communications (e.g., radio-frequency signals in the low band, low-midband, midband, high band, and/or ultra-high band may be conveyed by antenna 40 over feed 112).

If desired, an antenna such as a wireless local area network and ultra-high band antenna may be formed within region 206. To help optimize performance (antenna efficiency) of antenna 40 and the antenna formed within region 206, at least a portion of ground plane 104 may be removed underneath region 206 (e.g., cutout region 206). Ground plane 104 may have any desired shape within device 10. For example, ground plane 104 may align with gap 18-1 in peripheral conductive hosing structures 16 (e.g., the lower edge of gap 18-1 may be aligned with the edge of ground plane 104 defining slot 101 adjacent to gap 18-1 such that the lower edge of gap 18-1 is approximately collinear with the edge of ground plane 104 at the interface between ground plane 104 and the portion of peripheral conductive structures 16 adjacent to gap 18-1). This example is merely illustrative and, in another suitable arrangement, ground plane 104 may have an additional vertical slot adjacent to gap 18-1 that extends below gap 18-1 (e.g., along the Y-axis of FIG. 5).

If desired, ground plane 104 may include a vertical slot 162 adjacent to gap 18-2 that extends beyond the lower edge (e.g., lower edge 216) of gap 18-2 (e.g., in the direction of the Y-axis of FIG. 5). Slot 162 may, for example, have two edges that are defined by ground 104 and one edge that is defined by peripheral conductive structures 16. Slot 162 may have an open end defined by an open end of slot 101 at gap 18-2. Slot 162 may have a width 172 that separates ground 104 from the portion of peripheral conductive structures 16 below slot 18-2 (e.g., in the direction of the X-axis of FIG. 5). Because the portion of peripheral conductive structures 16 below gap 18-2 is shorted to ground 104 (and thus forms part of the antenna ground for antenna structures 40), slot 162 may effectively form an open slot having three sides defined by the antenna ground for antenna structures 40. Slot 162 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 162 may have an elongated length 178 (e.g., perpendicular to width 172). Slot 162 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.). Electronic device 10 may be characterized by longitudinal axis 282. Length 178 may extend parallel to longitudinal axis 282 (and the Y-axis). Portions of slot 162 may contribute slot antenna resonances to antenna 40 in one or more frequency bands if desired. For example, the length and width of slot 162 may be selected so that antenna 40 resonates at desired operating frequencies. If desired, the overall length of slots 101 and 162 may be selected so that antenna 40 resonates at desired operating frequencies.

Adjustable component 114 may bridge slot 101 at a first location along slot 101 (e.g., component 114 may be coupled between terminal 126 on ground plane 104 and terminal 128 on peripheral conductive structures 16). Component 114 may include switches coupled to fixed components such as inductors for providing adjustable amounts of inductance or an open circuit between ground 104 and peripheral conductive structures 16. Component 114 may also include fixed components that are not coupled to switches or a combination of components that are coupled to switches and components that are not coupled to switches. These examples are merely illustrative and, in general, component 114 may include other components such as adjustable return path switches, switches coupled to capacitors, or any other desired components. Adjustable component 114 may include one or more inductors coupled to a radio-frequency switching circuit. In one illustrative example, adjustable component 114 may include two inductors coupled in parallel between terminals 126 and 128. A radio-frequency switching circuit may selectively couple the inductors between terminals 126 and 128 to tune the antenna. Additional adjustable components may be included at any desired location within electronic device 10 (i.e., between resonating element arm 108 and ground 104, between different portions of element 108, across gap 18-1 or gap 18-2, etc.).

The resonance of antenna 40 within low band LB (e.g., 700 MHz to 960 MHz or other suitable frequency range) may be associated with the distance along peripheral conductive structures 16 between feed 112 and gap 18-2, for example. FIG. 5 is a view from the front of device 10, so gap 18-2 of FIG. 5 lies on the right edge of device 10 when device 10 is viewed from the front (e.g., the side of device 10 on which display 14 is formed) and lies on the left edge of device 10 when device 10 is viewed from behind. Tunable components such as component 114 may be used to tune the response of antenna 40 in low band LB. The resonance of antenna 40 in midband MB (e.g., 1710 MHz to 2170 MHz) may be associated with the distance along peripheral conductive structures 16 between feed 112 and gap 18-1, for example. Tunable components such as component 114 may be used to tune the response of antenna 40 in midband MB, if desired. Antenna performance in high band HB (e.g., 2300 MHz to 2700 MHz) may be supported by slot 162 in ground plane 104 and/or by a harmonic mode of the resonance associated with arm 108. Tunable components such as component 114 may be used to tune the response of antenna 40 in high band HB, if desired.

Antenna structures 40 may have a return path such as return path 110 coupled between arm 108 (at terminal 202) and ground 104 (at terminals 204-1 and 204-2). Return path 110 may include one or more inductors such as inductors 212 and 214. If desired, inductors 212 and 214 may be coupled in parallel between terminal 202 on peripheral conductive housing structure 16 and different locations on ground 104. For example, inductor 212 may be coupled between terminal 202 and ground terminal 204-1, whereas inductor 214 is coupled between terminal 202 and ground terminal 204-2. Inductor 212 may therefore form a first conductive path (branch) of split return path 110 between terminal 202 and terminal 204-1 whereas inductor 214 forms a second conductive path (branch) of split return path 110 between terminal 202 and terminal 204-2. Inductors 212 and 214 may be fixed inductors or may be adjustable inductors. For example, each inductor may be coupled to a switch that selectively opens to disconnect the inductor between terminal 202 and ground 104. Inductors 212 and 214 may be adjusted (e.g., corresponding switches may be opened or closed) to tune the resonance of antenna structures 40 in the low band, midband, high band, and/or other bands.

In this way, return path 110 may be split between a single point 202 on peripheral conductive housing structures 16 and multiple points on ground 104. Because return path 110 is split between two branches that are coupled in parallel between terminal 202 and ground 104, return path 110 may sometimes be referred to herein as a split short path or a split return path. The split short path may, for example, improve antenna efficiency for the non-near-field communications antenna formed from structures 40 relative to scenarios where the return path is implemented using a single conductive path between terminal 202 and ground 104.

Terminals 202, 204-1, and 204-2 may include any desired conductive structures. For example, terminal 202 may include a conductive screw that is attached to peripheral conductive housing structures 16. Terminal 204-1 may include a conductive screw that is attached to a portion of ground 104 such as a conductive layer of housing 12 (e.g., a backplate of housing 12). If desired, at terminal 204-1, another conductive structure such as a spring or pin may electrically connect the conductive support plate to a conductive portion of display 14 (e.g., a grounded portion of display 14 that forms a part of ground 104 for antenna 40). Terminal 204-2 may have the same structure as terminal 204-1 or may have a different structure than terminal 204-1. The position of terminals 204-1 and 204-2 may be adjusted to tweak the antenna efficiency and frequency response of antenna 40 (e.g., to tune antenna 40 to resonate at desired frequencies). Terminals 204-1 and 204-2 may be separated by any desired distance (e.g., between 2 and 15 millimeters, between 8 and 20 millimeters, between 5 and 15 millimeters, between 10 and 25 millimeters, between 5 and 30 millimeters, greater than 2 millimeters, greater than 5 millimeters, greater than 8 millimeters, greater than 10 millimeters, greater than 15 millimeters, less than 10 millimeters, less than 15 millimeters, less than 20 millimeters, less than 30 millimeters, etc.).

As previously discussed, a portion of ground plane 104 may be removed adjacent to gap 18-1 (e.g., to help improve performance of the wireless local area network and ultra-high band antenna in region 206). The removed portion of ground plane 104 may sometimes be referred to as a cutout. The cutout may have a width 247. Width 247 may be between 2 and 15 millimeters, between 8 and 12 millimeters, between 5 and 15 millimeters, between 10 and 20 millimeters, between 5 and 30 millimeters, greater than 2 millimeters, greater than 5 millimeters, greater than 8 millimeters, greater than 10 millimeters, greater than 15 millimeters, less than 10 millimeters, less than 15 millimeters, less than 20 millimeters, less than 30 millimeters, or any other desired distance. Distance 247 may be adjusted to improve the antenna efficiency and ensure the antenna resonates in desired frequency bands. In embodiments where antenna ground 104 includes multiple layers (e.g., both a conductive layer of housing 12 and a conductive portion of display 14), the cutout may only be formed in a subset of the layers. For example, the cutout may only be formed in the conductive layer of housing 12 and not in the conductive portion of display 14.

Figure 6:
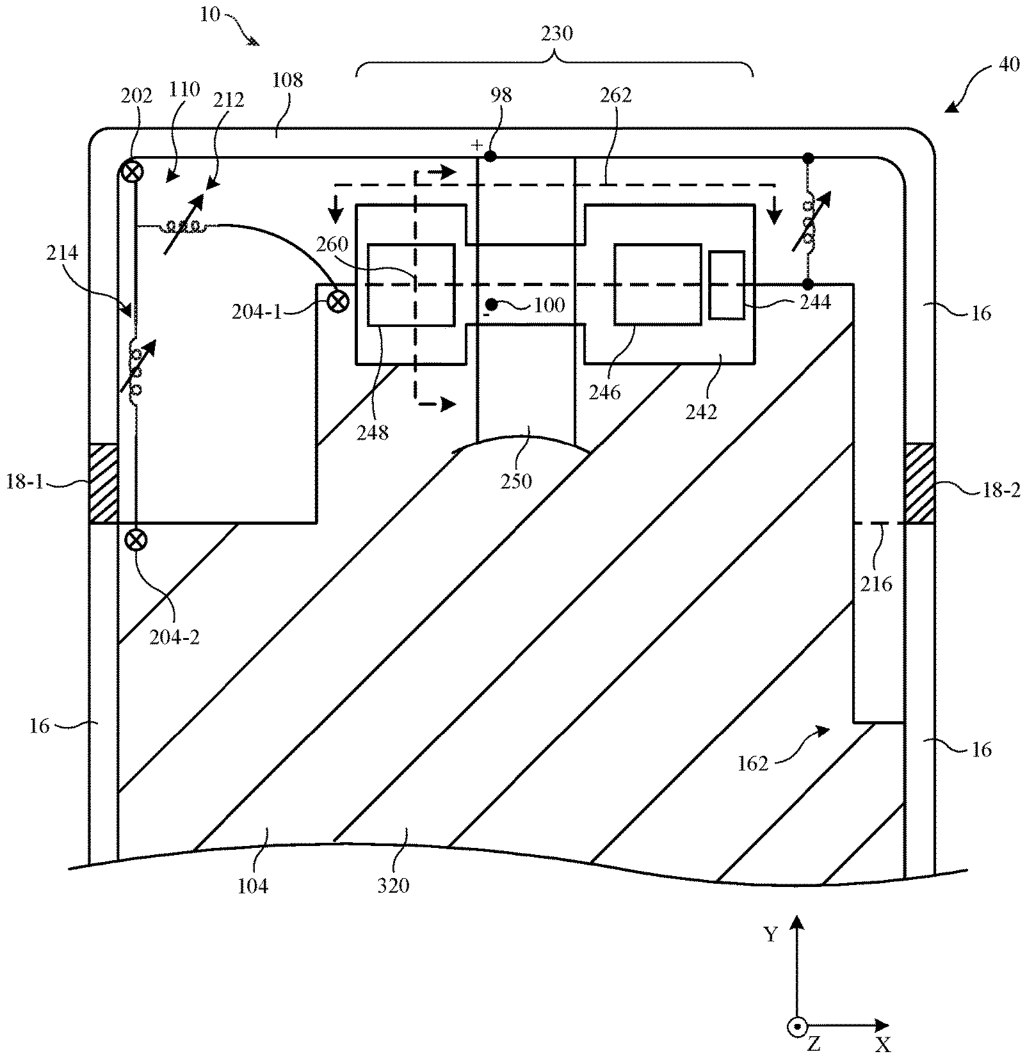
FIG. 6 is a top view of an illustrative electronic device showing how a distributed capacitance of the type shown in FIG. 5 may be formed between an antenna ground and an antenna resonating element in accordance with an embodiment.

FIG. 6 is a top view of an illustrative electronic device showing how a distributed capacitance of the type shown in FIG. 5 may be formed between an antenna ground and an antenna resonating element. As shown in FIG. 6, antenna ground 104 may include a conductive portion of housing 12 such as conductive housing layer 320. To decrease the distance between ground 104 and peripheral conductive housing structures 16 (e.g., within distributed capacitance region 230), additional components within electronic device 10 may be electrically connected to conductive housing layer 320 and form portions of the antenna ground 104.

In the example of FIG. 6, electronic device 10 includes electronic components 244, 246, and 248. Electronic components 244, 246, and 248 may be any desired type of components. In some embodiments, components 244, 246, and/or 248 may be input-output components or form portions of input-output components (e.g., input-output devices 32 in FIG. 2) such as a button, camera, speaker, status indicator, light source, light sensor, position and orientation sensor (e.g., an accelerometer, gyroscope, compass, etc.), capacitance sensor, proximity sensor (e.g., capacitive proximity sensor, light-based proximity sensors, etc.), fingerprint sensor, etc. In one suitable arrangement, electronic components 244 and 246 may be sensors such as light-based sensors (e.g., camera modules) and electronic component 248 may be an emitter that emits light.

Electronic components 244, 246, and 248 may be supported by a conductive frame 242 that is electrically connected to conductive housing layer 320. Conductive frame 242 may extend closer to peripheral conductive housing structures 16 than conductive housing layer 320. In this way, the distance between antenna ground 104 and peripheral conductive housing structures 16 is decreased in region 230 to form a desired distributed capacitance between antenna ground 104 and peripheral conductive housing structures 16. If desired, conductive frame 242 may provide radio-frequency shielding for electronic components 244, 246, and 248 in addition to mechanically supporting the electronic components (e.g., conductive frame 242 may shield the components from radio-frequency signals conveyed using antenna 40).

A substrate such as printed circuit 250 may pass underneath conductive frame 242 between components 246 and 248. Printed circuit 250 may be a rigid printed circuit board (e.g., a printed circuit board formed from fiberglass-filled epoxy or other rigid printed circuit board material) or may be a flexible printed circuit (e.g., a flexible printed circuit formed from a sheet of polyimide or other flexible polymer layer). Printed circuit 250 may include antenna traces such as an antenna resonating element, (e.g., for a wireless local area network and ultra-high band antenna in region 206 of FIG. 5), transmission line structures (e.g., transmission line structures for transmission line 92 of FIG. 5) surface mount technology components, terminals for an antenna feed (e.g., positive feed terminal 98 or ground feed terminal 100 of FIG. 5), or any other desired traces or components. A conductive fastener such as a screw or another desired conductive structure (e.g., a bracket, clip, spring, pin, screw, solder, weld, conductive adhesive, wire, metal strip, or a combination of these) may electrically connect flexible printed circuit board 250 to peripheral conductive housing structures 16 at positive antenna feed terminal 98. Printed circuit board 250 may be coupled to an additional printed circuit that includes transceiver circuitry (e.g., transceiver circuitry 90 in FIG. 5), if desired.

Figure 7:
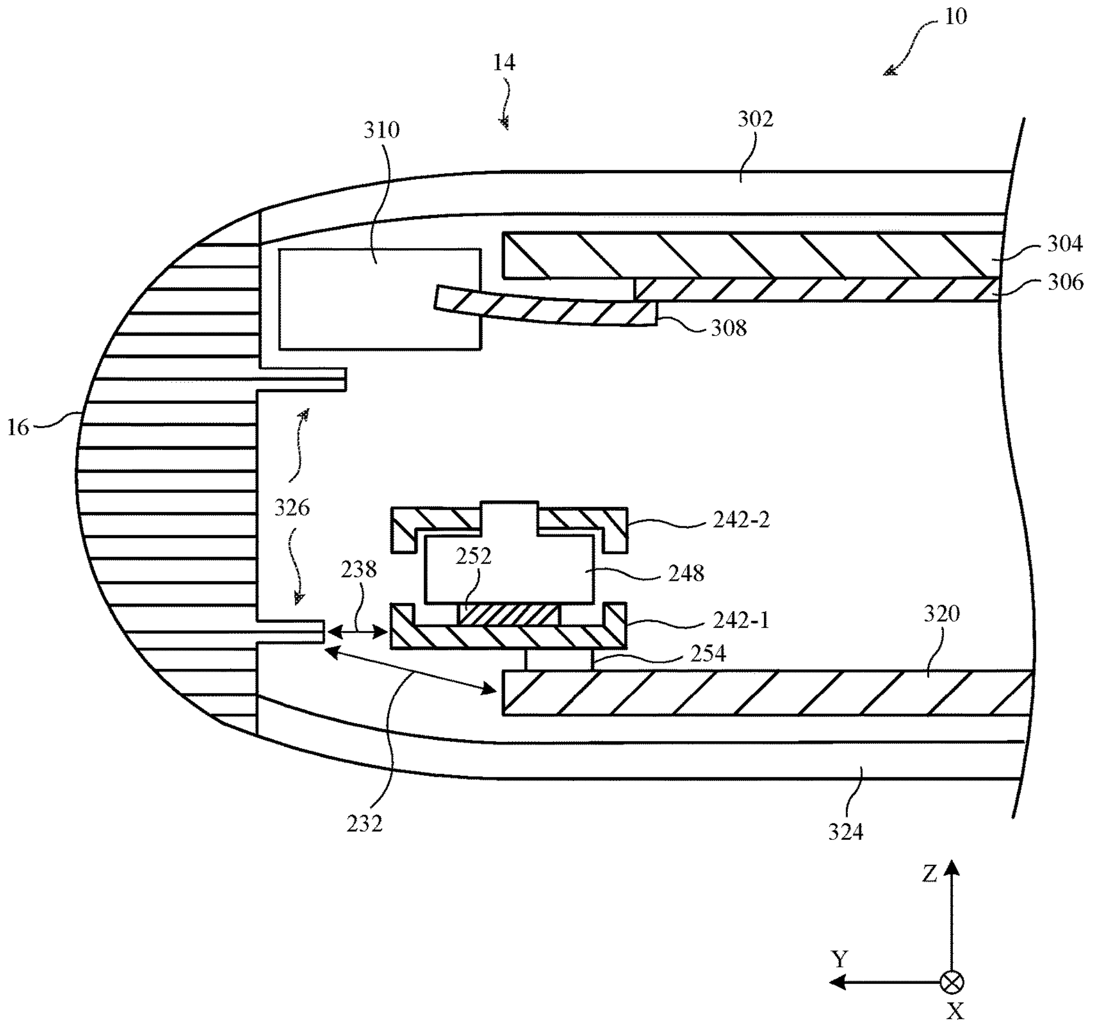
FIGS. 7 and 8 are cross-sectional side views of an illustrative electronic device showing how a distributed capacitance of the type shown in FIG. 5 may be formed between an antenna ground and an antenna resonating element in accordance with an embodiment.

FIG. 7 is a cross-sectional side view of electronic device 10 taken along line 260 in FIG. 6. As shown in FIG. 7, display 14 for electronic device 10 may include a display cover layer such as display cover layer 302 that covers display panel 304. Display panel 304 (sometimes referred to as a display module) may be any desired type of display panel and may include pixels formed from light-emitting diodes (LEDs), organic LEDs (OLEDs), plasma cells, electrowetting pixels, electrophoretic pixels, liquid crystal display (LCD) components, or other suitable pixel structures. The lateral area of display panel 304 may, for example, determine the size of active area AA of display 14 (FIG. 1). Display panel 304 may include active light emitting components, touch sensor components (e.g., touch sensor electrodes), force sensor components, and/or other active components. Display cover layer 302 may be a layer of clear glass, plastic, or other dielectric that covers the light-emitting surface of the underlying display panel. In another suitable arrangement, display cover layer 302 may be the outermost layer of display panel 304 (e.g., layer 302 may be a color filter layer, thin-film transistor layer, or other display layer). Buttons may pass through openings in cover layer 302 (see button 24 in FIG. 1). The cover layer may also have other openings such as an opening for a speaker port (see speaker port 26 in FIG. 1), openings for a sensor (e.g., sensor 248), or openings for any other desired electronic component.

Display panel 304 may be supported within electronic device 10 by a conductive display support plate (sometimes referred to as a midplate or display plate) such as display plate 306. Conductive display frame 308 may hold display plate 306 and/or display panel 304 in place on housing 12. For example, display frame 308 may be ring-shaped and may include a portion that runs around the periphery of the display panel 304 and surrounds a central opening. Display plate 306 and display frame 308 may both be formed from conductive material (e.g., metal). Display plate 306 and display frame 308 may be in direct contact such that the display plate 306 and the display frame 308 are electrically connected. If desired, display plate 306 and display frame 308 may be formed integrally (e.g., from the same piece of metal).

A plastic frame 310 may be molded around display frame 308. Plastic frame 310 may also be ring-shaped (similar to display frame 308). Electronic device 10 may have a rectangular periphery with upper and lower edges coupled together by left and right edges. Plastic frame 310 may run around the rectangular periphery of electronic device 10. Plastic frame 310 may be formed from molded plastic or any other desired dielectric material and may serve to mount frame 308 and thus plate 306 and panel 304 to peripheral conductive housing structures 16. Conductive frame 308, conductive plate 306, and conductive portions of panel 304 (e.g., conductive electrodes, pixel circuitry, ground layers, ferrite layers, shielding layers, etc.) may form a portion of antenna ground 104 for antenna 40 (FIG. 5).

Peripheral conductive housing structure 16 may have integral ledge portions 326. Integral ledge portions 326 may extend away from peripheral conductive housing structure 16 towards the interior of electronic device 10. Integral ledge portions 326 may be used to mount various components within electronic device 10 if desired. For example, in one illustrative embodiment plastic frame 310 may be supported by a ledge portion 326 of peripheral conductive housing structure 16.

As shown in FIG. 7, housing 12 (FIG. 1) may include dielectric housing portions such as dielectric layer 324 and conductive housing portions such as conductive layer 320 (sometimes referred to herein as conductive housing wall 320). If desired, dielectric layer 324 may by formed under layer 320 such that layer 324 forms an exterior surface of device 10 (e.g., thereby protecting layer 320 from wear and/or hiding layer 320 from view of a user). Conductive housing portion 320 may form a portion of ground 104. As examples, conductive housing portion 320 may be a conductive support plate or wall (e.g., a conductive back plate or rear housing wall) for device 10. Conductive housing portion 320 may, if desired, extend across the width of device 10 (e.g., between two opposing sidewalls formed by peripheral housing structures 16). If desired, conductive housing portion 320 and the opposing sidewalls of device 10 may be formed from a single integral piece of metal or portion 320 may otherwise be shorted to the opposing sidewalls of device 10. Dielectric layer 324 may be a thin glass, sapphire, ceramic, or sapphire layer or other dielectric coating, as examples. In another suitable arrangement, layer 324 may be omitted if desired.

At each ground terminal within the device (e.g., terminals 204-1, 204-2, 100, 126), different components of the device ground (e.g., ground 104 in FIG. 5) may be electrically connected so that the conductive structures that are located closest to resonating element arm 108 are held at a ground potential and form a part of antenna ground 104. In one suitable arrangement, ground 104 includes both conductive portions of housing 12 (e.g., portions of a rear wall of housing 12 such as a conductive backplate 320 and portions of peripheral conductive housing structures 16 that are separated from arm 108 by peripheral gaps 18) as well as conductive portions of display 14 (e.g., conductive portions of display panel 304, conductive plate 306, and/or conductive frame 308). Vertical conductive structures (e.g., a bracket, clip, spring, pin, screw, solder, weld, conductive adhesive, wire, metal strip, or a combination of these) may couple conductive portions of housing 12 (e.g., a conductive backplate) to conductive portions of display 14 at terminals 204-1, 204-2, and/or 100. Ensuring that the conductive structures close to resonating element arm 108 such as conductive portions of display 14 are held at a ground potential may, for example, serve to optimize the antenna efficiency of antenna structures 40. In one suitable arrangement, ground terminals 204-1, 204-2, 126 and/or 100 may include a conductive structure such as a spring that electrically connects the conductive backplate to the conductive display portion that forms an additional portion of the device ground.

Electronic component 248 may be contained within conductive frame portion 242-1 (sometimes referred to as lower conductive frame portion 242-1) and conductive frame portion 242-2 (sometimes referred to as upper conductive frame portion 242-2). Lower conductive frame portion 242-1 may be electrically connected to conductive housing layer 320 by conductive structure 254. Conductive structure 254 may be any desired conductive structure (e.g., a bracket, clip, spring, pin, screw, solder, weld, conductive adhesive, wire, metal strip, or a combination of these). Because conductive frame portion 242-1 is electrically connected to conductive housing layer 320 by conductive structure 254, conductive frame portion 242-1 may form a portion of the antenna ground (e.g., antenna ground 104). Conductive frame portion 242-1 may be electrically connected to conductive frame portion 242-2 such that conductive frame portion 242-2 also forms a portion of the antenna ground. Similarly, if desired, conductive portions of electronic component 248 may be electrically connected to conductive frame portion 242-1 using conductive adhesive 252. In this arrangement, conductive portions of electronic component 248 also form a portion of the antenna ground. The example of conductive adhesive being used to electrically connect component 248 to frame 242-1 is merely illustrative. Any desired conductive structure (e.g., a bracket, clip, spring, pin, screw, solder, weld, conductive adhesive, wire, metal strip, or a combination of these) may electrically connect component 248 to frame 242-1. The aforementioned examples of various components being included in antenna ground 104 are merely illustrative. In general, any desired components may be included in the antenna ground.

As shown in FIG. 7, peripheral conductive housing structures 16 may be separated from lower frame portion 242-1 by a smaller distance (distance 238) than the conductive housing portion (distance 320). Because lower frame portion 242-1 is shorted to conductive housing portion 320, lower frame portion 242-1 forms a portion of antenna ground 104. Therefore, peripheral conductive housing structures 16 are only separated from the antenna ground by distance 238. If lower frame portion 242-1 was omitted or did not form a portion of the antenna ground, the peripheral conductive housing structures 16 would be separated from the antenna ground by the increased distance 232. Decreasing the distance between peripheral conductive housing structures 16 and the antenna ground in these types of arrangements forms a selected distributed capacitance in the distributed capacitance region (FIG. 5). The distributed capacitance between the peripheral conductive housing structures 16 and the antenna ground may, for example, improve the efficiency of antenna structures 40 by ensuring that feed 112 is impedance matched to transmission line 92.

Figure 8:
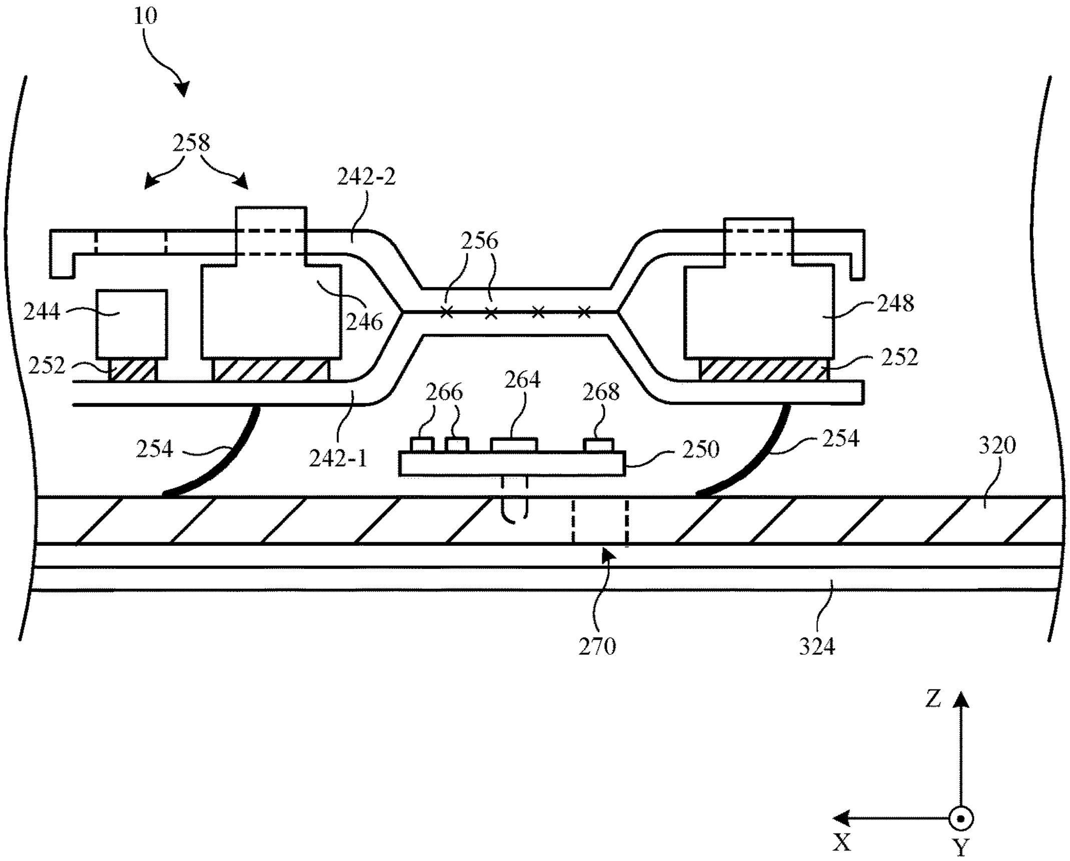

FIG. 8 is a cross-sectional side view of electronic device 10 taken along line 262 in FIG. 6. As shown in FIG. 8, electronic components 244, 246, and 248 may be interposed between conductive frame portions 242-1 and 242-2. Conductive frame portions 242-1 and 242-2 may be electrically connected using welds 256 or other desired conductive structures (e.g., a bracket, clip, spring, pin, screw, solder, conductive adhesive, wire, metal strip, or a combination of these). Conductive structures 254 such as springs may be placed on either side of flexible printed circuit board 250. Each spring may electrically connect conductive housing layer 320 to lower conductive frame portion 242-1. Other arrangements may be used to electrically connect conductive housing layer 320 to conductive frame portion 242-1, if desired. Each electronic component may be electrically connected and mechanically secured to conductive frame portion 242-1 using conductive adhesive 252 or other desired conductive structures (e.g., a bracket, clip, spring, pin, screw, solder, conductive adhesive, wire, metal strip, or a combination of these). Therefore, conductive portions of each electronic component may form portions of the antenna ground (e.g., antenna ground 104 in FIG. 5).

The upper conductive frame portion 242-2 may have openings such as openings 258. Openings 258 may accommodate portions of the electronic components (e.g., portions of electronic components 246 and 248 may extend through respective openings). Openings 258 may allow light to reach or be transmitted from the electronic components (e.g., electrical component 244 may emit light through a respective opening).

A conductive fastener such as a screw 264 or another desired conductive structure (e.g., a bracket, clip, spring, pin, screw, solder, weld, conductive adhesive, wire, metal strip, or a combination of these) may electrically connect and/or mechanically secure flexible printed circuit board 250 to conductive housing layer 320. A screw boss or threaded opening in conductive housing layer 320 may receive screw 264.

Flexible printed circuit board 250 may include transmission line structures such as transmission line structures 266 (e.g., ground signal conductor 96 and/or positive signal conductor 94 in FIG. 5). Additional components for antenna 40 in FIG. 5 may be mounted on flexible printed circuit 250. For example, a tunable component 268 that is used to tune the frequency response of antenna 40 may be mounted on flexible printed circuit 250. If desired, conductive housing layer 320 may include an opening 270 underneath tunable component 268 to mitigate radio-frequency interference.

Figure 9:
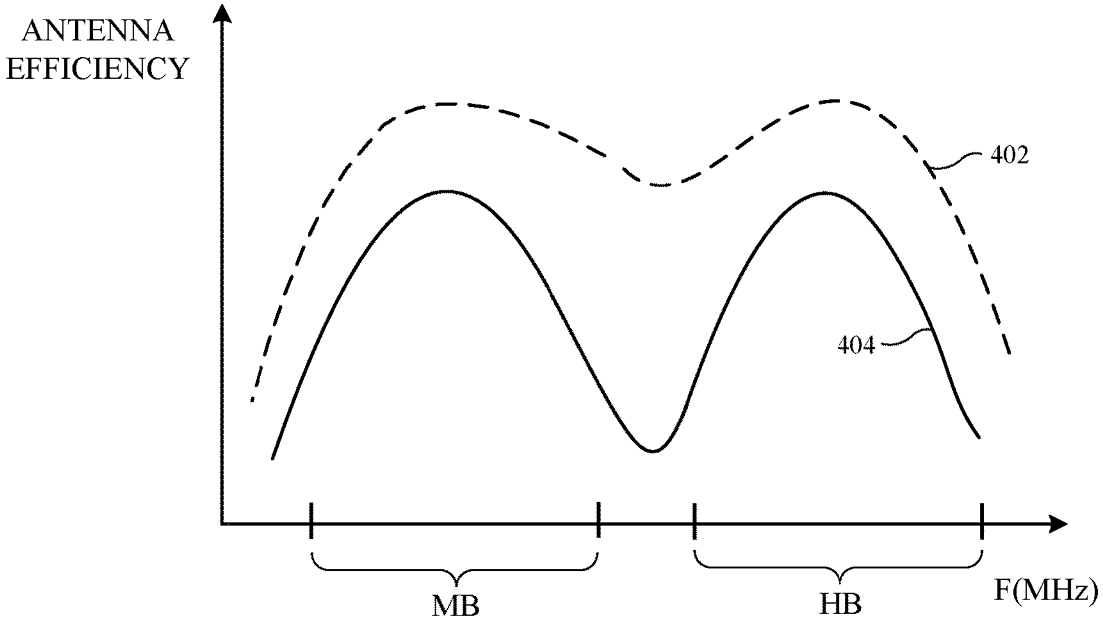
FIG. 9 is a graph of antenna performance (antenna efficiency) as a function of frequency for an antenna of the type shown in FIGS. 5-8 in accordance with an embodiment.

FIG. 9 is a graph of antenna efficiency as a function of frequency for an illustrative antenna of the type shown in FIGS. 5-8. As shown in FIG. 9, antenna 40 may exhibit resonances in midband MB and high band HB. The midband MB may extend from 1710 MHz to 2170 MHz or other suitable frequency range. The high band MB may extend from 2300 MHz to 2700 MHz or other suitable frequency range. As shown in FIG. 9, antenna 40 may have an antenna efficiency characterized by curve 402 in midband MB and high band HB when there is a distributed capacitance (e.g., in region 230 of FIG. 5) formed between antenna ground 104 and peripheral conductive housing structures 16. Antenna 40 may have an antenna efficiency characterized by curve 404 in midband MB and high band HB when the distributed capacitance is omitted (and the antenna ground is separated from the peripheral conductive housing structures by distance 232). When the distributed capacitance is omitted, antenna feed 112 may be poorly matched to transmission line 92, thereby leading to a reduction in overall antenna efficiency for antenna 40. Forming the distributed capacitance using peripheral conductive structures 16 and components of antenna ground 104 such as the lower frame portion 242-1 may ensure that antenna feed 112 is well matched to transmission line 92 and may therefore serve to improve the overall antenna efficiency for antenna 40, as shown by curve 402. This example is merely illustrative and, if desired, the curves may have any shapes in any bands. If desired, antenna 40 may exhibit resonances in a subset of these bands and/or in additional bands.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:

a housing having peripheral conductive structures;

an antenna resonating element arm formed form a segment of the peripheral conductive structures; and an antenna ground comprising a first conductive portion that is separated from the antenna resonating element arm by a first distance and a second conductive portion that is electrically connected to the first conductive portion and that is separated from the antenna resonating element arm by a second distance that is less than the first distance, wherein the second conductive portion is configured to form a distributed capacitance with the antenna resonating element arm.

2. The electronic device defined in claim 1, wherein the segment of the peripheral conductive structures is a first segment, the electronic device further comprising:

a first dielectric-filled gap in the peripheral conductive structures that separates the first segment from a second segment of the peripheral conductive structures; and a second dielectric-filled gap in the peripheral conductive structures that separates the first segment from a third segment of the peripheral conductive structures.

3. The electronic device defined in claim 2, wherein the first conductive portion comprises a planar conductive layer that extends between the second and third segments of the peripheral conductive structures.

4. The electronic device defined in claim 3, further comprising:

an electronic component, wherein the second conductive portion comprises a conductive frame for the electronic component.

5. The electronic device defined in claim 4, wherein the electronic component comprises a sensor.

6. The electronic device defined in claim 4, further comprising:

conductive adhesive that attaches the electronic component to the conductive frame.

7. The electronic device defined in claim 4, further comprising:

a display, wherein the antenna ground further comprises a conductive portion of the display.

8. The electronic device defined in claim 4, wherein the planar conductive layer includes a vertical slot that extends beyond an edge of the second dielectric-filled gap and the vertical slot has edges defined by the planar conductive layer and the third segment of the peripheral conductive structures.

9. The electronic device defined in claim 1, further comprising:

a split return path coupled between a first point on the antenna resonating element arm and second and third points on the antenna ground.

10. An electronic device comprising:

a housing having peripheral conductive structures;

an antenna resonating element arm for an antenna, wherein the antenna resonating element arm is formed form the peripheral conductive structures;

an antenna ground for the antenna, wherein the antenna ground comprises a first conductive structure that is separated from the antenna resonating element arm by a first distance and a second conductive structure that is electrically connected to the first conductive structure and separated from the antenna resonating element arm by a second distance that is less than the first distance;

an antenna feed for the antenna, wherein the antenna feed has a first feed terminal coupled to the antenna resonating element arm and a second feed terminal coupled to the antenna ground; and a distributed impedance matching capacitor for the antenna that is formed from the second conductive structure and the antenna resonating element arm.

11. The electronic device defined in claim 10, wherein the first feed terminal is coupled to a portion of the antenna resonating element arm that forms the distributed impedance matching capacitor.

12. The electronic device defined in claim 10, further comprising:

an additional distributed impedance matching capacitor for the antenna that is formed from the second conductive structure and the antenna resonating element arm, wherein the first feed terminal is interposed between the distributed impedance matching capacitor and the additional distributed impedance matching capacitor.

13. The electronic device defined in claim 10, wherein the second conductive structure comprises a conductive frame for an electronic component.

14. The electronic device defined in claim 13, wherein the conductive frame has a lower portion and an upper portion that are electrically connected and the electronic component is interposed between the lower portion of the conductive frame and the upper portion of the conductive frame.

15. The electronic device defined in claim 14, further comprising:

a flexible printed circuit interposed between the first conductive structure and the lower portion of the conductive frame; and a fastener that attaches the flexible printed circuit to the first conductive structure.

16. The electronic device defined in claim 14, further comprising:

a third conductive structure that electrically connects the lower portion of the conductive frame to the first conductive structure.

17. An electronic device comprising:

a housing having peripheral conductive structures and a planar conductive layer extending between first and second segments of the peripheral conductive structures;

a first dielectric-filled gap in the peripheral conductive structures that separates the first segment from a third segment of the peripheral conductive structures;

a second dielectric-filled gap in the peripheral conductive structures that separates the second segment from the third segment;

an antenna resonating element formed from at least the third segment of the peripheral conductive structures;

a conductive component frame; and an antenna ground formed from at least the planar conductive layer, the first and second segments of the peripheral conductive structures, and the conductive component frame, wherein the planar conductive layer is separated from the antenna resonating element by a first distance and the conductive component frame is separated from the antenna resonating element by a second distance that is less than the first distance.

18. The electronic device defined in claim 17, wherein the conductive component frame is configured to form a distributed impedance matching capacitance with the antenna resonating element.

19. The electronic device defined in claim 17, wherein the planar conductive layer includes a vertical slot that extends beyond an edge of the second dielectric-filled gap and the vertical slot has edges defined by the planar conductive layer and the second segment of the peripheral conductive structures.

20. The electronic device defined in claim 17, further comprising:

a camera module interposed between a lower portion of the conductive component frame and an upper portion of the conductive component frame.

* * * * *